United States Patent [19]
Perrot

[11] Patent Number: 5,635,874
[45] Date of Patent: Jun. 3, 1997

[54] STABLE DISTORTION AMPLIFIER FOR AUDIO SIGNALS

[76] Inventor: Gerard Perrot, 16 rue Boileau, F-92120 Montrouge, France

[21] Appl. No.: 481,299

[22] PCT Filed: Dec. 29, 1993

[86] PCT No.: PCT/FR93/01316

§ 371 Date: Jul. 31, 1995

§ 102(e) Date: Jul. 31, 1995

[87] PCT Pub. No.: WO94/16494

PCT Pub. Date: Jul. 21, 1994

[30] Foreign Application Priority Data

Dec. 30, 1992 [FR] France ................................... 92 15943

[51] Int. Cl.⁶ ........................... H03F 3/45; H03F 1/34
[52] U.S. Cl. ........................ 330/259; 330/260; 330/290
[58] Field of Search .......................... 330/259, 260, 330/290

[56] References Cited

U.S. PATENT DOCUMENTS

| | | | |
|---|---|---|---|
| 3,916,333 | 10/1975 | Zuk | 330/259 |
| 4,301,421 | 11/1981 | Yokoyama | 330/259 X |
| 4,769,617 | 9/1988 | Mizuide | 330/260 |

FOREIGN PATENT DOCUMENTS

| | | | |
|---|---|---|---|
| 566510 | 1/1981 | Japan | 330/259 |
| 119512 | 9/1981 | Japan | 330/259 |
| 61-043005 | 7/1986 | Japan . | |
| 8903612 | 11/1987 | WIPO . | |

OTHER PUBLICATIONS

"Ultra–Low–Noise Amplifiers and Granularity Distortion", D.R.G. Self, The Journal of Audio Engineering Society, vol. 35, No. 11, Nov. 1987, pp. 907–915.

*Primary Examiner*—James B. Mullins
*Attorney, Agent, or Firm*—Bachman & LaPointe, P.C.

[57] ABSTRACT

The invention relates to an amplifier for audio signals comprising a first ($A_1$) and a second ($A_2$) stage having a global feedback loop (B) between the output of the second stage and the input of the first stage, the second stage having a local feedback loop ($B_2$) between its output and its input. Each feedback loop has a comparator element ($C_1$). The amplifier comprises a means preventing the offset voltage present at the output of the first stage ($A_1$) from being reinjected as input by feedback (in particular via the amplifier output). The local feedback loop ($B_2$) is such that the second stage ($A_2$) receives feedback at least continuously. The low frequency interference signals produced in the second stage ($A_2$) are reduced by the feedback of the second stage ($A_2$).

10 Claims, 5 Drawing Sheets

STABLE DISTORTION AMPLIFIER FOR AUDIO SIGNALS

The present invention relates to the field of electronics for audio signals. It concerns an analog circuit for the processing or amplifying of audio electric signals.

The audio circuits should be linear, that is to say, generate the least possible distortion. This expression covers the deformations which the circuit imposes on the signal and which are related to this signal, in opposition to the noise or parasitic signals which are uncorrelated to the signal.

The distortion produced by a circuit is traditionally measured by using signals of constant amplitude and it consists in measuring the ratio between the energy of the signals generated by the distortion and the energy of the test signal. This method of measurement fails to take two facts into account:

On the one hand, the perception by the auditory system of the signals generated by the distortion does not depend only on their energy;

On the other hand, the use of test signals of stable level does not completely define the behavior of the circuits tested; thus, the frequent variations in level of the signals customarily amplified by the audio signals (signals of musical origin) may, particularly in transistor amplifiers, generate parasitic signals of very low frequency related to the amplitude of the signal which, while they remain inaudible and are generally eliminated by the circuits themselves, can modulate the distortions, making them thus more audible.

For example, in the case of a circuit generating a distortion formed of a second order distortion with an amplitude of 0.5% and third order distortion with an amplitude of 0.25% (and therefore very linear), the superposing of an interference signal of very low frequency (a few hertz) will lead to a modulation of the distortion of the desired signal at the frequency of the interference signal. This phenomenon generally remains negligible, but if the amplitude of the interference signal is substantial, it becomes significant; in the case of our example, an amplitude of the interference signal which is 10 times greater than the desired signal leads to a modulation of the second order distortion by about 6 dB, thus making it much more perceptible by the auditory system (a phenomenon known as emergence in psychoacoustics).

The phenomena generating such very low frequency interference signals may be:

modifications of base-emitter voltage of the transistors resulting from variations in temperature of their junctions related to variations in the power dissipated in these transistors as a function of the amplitude of the signal;

variations of the feed voltages, the filters of which are generally calculated to filter the frequencies of the desired signals while the consumption may vary at the slower rate of the variations in amplitude of the signal, particularly if all the signals are not operating in Class A.

Transistor audio circuits customarily employ high feedback ratios in order to be as linear as possible, but these high feedback ratios lead to substantial open-loop gains even for the continuous signals. The output quiescent point is therefore subject to important drifts in open loop. The global feedback therefore has two roles: to reduce the non-linearities and to stabilize the output quiescent point. However, this double role leads, as will be shown subsequently, to greatly amplifying, very low frequency interference signals (which correspond to the drifts of the output quiescent point) as compared with the desired signal at the input of the amplifier, generating an intermodulation between the desired signal and the deviations of the continuous signal at a point critical for the distortion. The present invention makes it possible to produce transistor circuits (or transistor and tube circuits) using high feedback ratios while avoiding these distortion modulating phenomena. For this, the circuits developed in accordance with the invention separate the linearizing action of the feedback from the stabilizing of the output quiescent point; they filter the signals reinjected into the input by the feedback loops eliminating upstream of the feedback loop the interference signals generated in the amplifier and assuring the stabilization of the output quiescent point, and they stabilize the operation of the input stage. The influence of the offset voltages and of the very low frequency signals (a few Hertz) is thus substantially decreased. Preferred variants furthermore make it possible significantly to increase the linearity of the circuit, the basic idea being the identification of the fact that, as will be shown subsequently, the intrinsic linearity of the comparator of the input stage is important in order to obtain a compensation of the distortion by action of the feedback, with the result that a stabilization, and therefore a reduction of the distortion, of a feedback amplifier imply for the input stage the control of the input signals, of its point of polarization, of the stability of its transfer function, and of the linearity of its transfer function.

The present invention thus concerns an amplifier with stabilized distortion for audio signals of the type having a global feedback and which furthermore, in accordance with variants, may present less distortion than the circuits of the prior art.

The invention first of all concerns a transistor amplifier for audio signals comprising a first and a second stage having a global feedback loop between the output of the second stage which constitutes the output of the amplifier and the input of the first stage, the second stage having a local feedback loop between its output and its input, the global feedback loop and the local feedback loop having first and second comparator elements respectively, characterized by the fact that the amplifier comprises a means capable of preventing the offset voltage present at the output of the first stage from being reinjected into the input by feedback (in particular, via the output of the amplifier), and by the fact that the second stage receives feedback at least continuously in such a manner that the low-frequency interference signals generated in the second stage are reduced by the feedback of the second stage which stabilizes its operating point. Such a circuit furthermore avoids the use of an output transformer of the second stage.

In accordance with one advantageous variant, the amplifier is characterized by the fact that the first and/or second comparator element is such that it has at least one critical transistor capable of producing variations of its transfer function as a function of the amplitude of the signals, and by the fact that said transistor is adapted to present a low and/or constant collector-emitter voltage $V_{CE}$ with a substantially constant current in its main current path so as to produce a stable and/or low heat dissipation in said critical transistor. This makes it possible, for instance, for the input transistor of the first stage to have its dissipated power reduced and/or stabilized by reduction of its emitter-collector voltage (to about 1 V) and/or by stabilization of its collector current and of it emitter-collector voltage. The reduction and/or stabilization of the power dissipated in this transistor and possibly in other transistors of the comparator of the first stage has the result that this comparator presents a transfer function which does not vary as a function of the amplitude of the signals processed. The same is true of the second stage, but the latter is, from this point of view, much less critical, as will be shown in the following description. The amplifier can then be characterized by the fact that said critical transistors of stable or low dissipation which form part of a comparator are thermally isolated from variations in temperature induced by other components, or thermally stabilized by a stabilization external to them.

In accordance with another variant of the amplifier, the first stages uses a load of high impedance, for instance an active load, so as to impart to it a high gain, and the second stage has a feedback which also processes the signals in the audio band.

In accordance with one advantageous variant, the amplifier is characterized by the fact that the first and/or the second stage uses a comparator of great linearity having two substages in series to form a local feedback.

In accordance with another advantageous variant, the amplifier is characterized by the fact that the first comparator has a combination of active elements, the non-linearities of which compensate for each other.

In accordance with a particularly advantageous embodiment, the amplifier developed in the manner that the first stage comprises two modules each of which has a first transistor of a first type of conductivity the base of which constitutes an input terminal for an input signal, the emitters of the first transistor of each module being coupled to form a differential stage, and a means for maintaining a substantially constant current in the collector-emitter path of the first transistor, said means comprising a feedback circuit having a main current path between an active terminal constituting an output of the first stage and the emitter of the first transistor, and by the fact that said means is formed by a first source of current connected to the collector of the first transistor, and by the fact that the feedback circuit is arranged in such a manner that the value of said main current is a function of the difference between the voltage of a reference voltage source and the potential of the collector of the first transistor, the gain of the feedback circuit being selected in such a manner that the potential of the collector of the first transistor is substantially constant.

In accordance with a preferred embodiment of this variant, the amplifier is characterized by the fact that the main current path of the feedback circuit comprises a second transistor of a second type of conductivity opposite the first type of conductivity, the collector of which is connected to the emitter of the first transistor the base of which is connected to the collector of the first transistor, and the emitter of which is connected to the emitter of a third transistor of a first type of conductivity, the base of which is connected to said reference voltage source and the collector of which constitutes said output of the first stage.

The feedback loop of the second stage stabilizes the output quiescent point. In order to eliminate the continuous components coming from the first stage, the second stage can thus comprise a capacitor arranged in series at the input of the second stage and, in this case, the feedback of the second stage can be independent of the frequency, or else the second stage can behave as a filter due to the selectivity of its local feedback loop.

In accordance with a preferred embodiment, the amplifier which has a feedback loop by resistive divider bridge between the output of the second stage and an input of the first stage is such that the first stage has a differential input stage and the second stage, which may be of differential type, has a local feedback loop comprising an integrator circuit the input of which is connected to the output of the second stage and the output of which is connected to a first input of a feedback differential stage, the outputs of the feedback differential stage having a second constant potential input, the outputs of the differential feedback stage being coupled to the respective inputs of the second stage so as to produce an active filter which, on the one hand, eliminates the continuous or low-frequency signals coming from the first stage and, on the other hand, those generated in the second stage, which stabilizes the operating point.

Other characteristics and advantages of the invention will become clear from the following description, given by way of illustration and not of limitation, read together with the drawings, in which.

Figure 1:
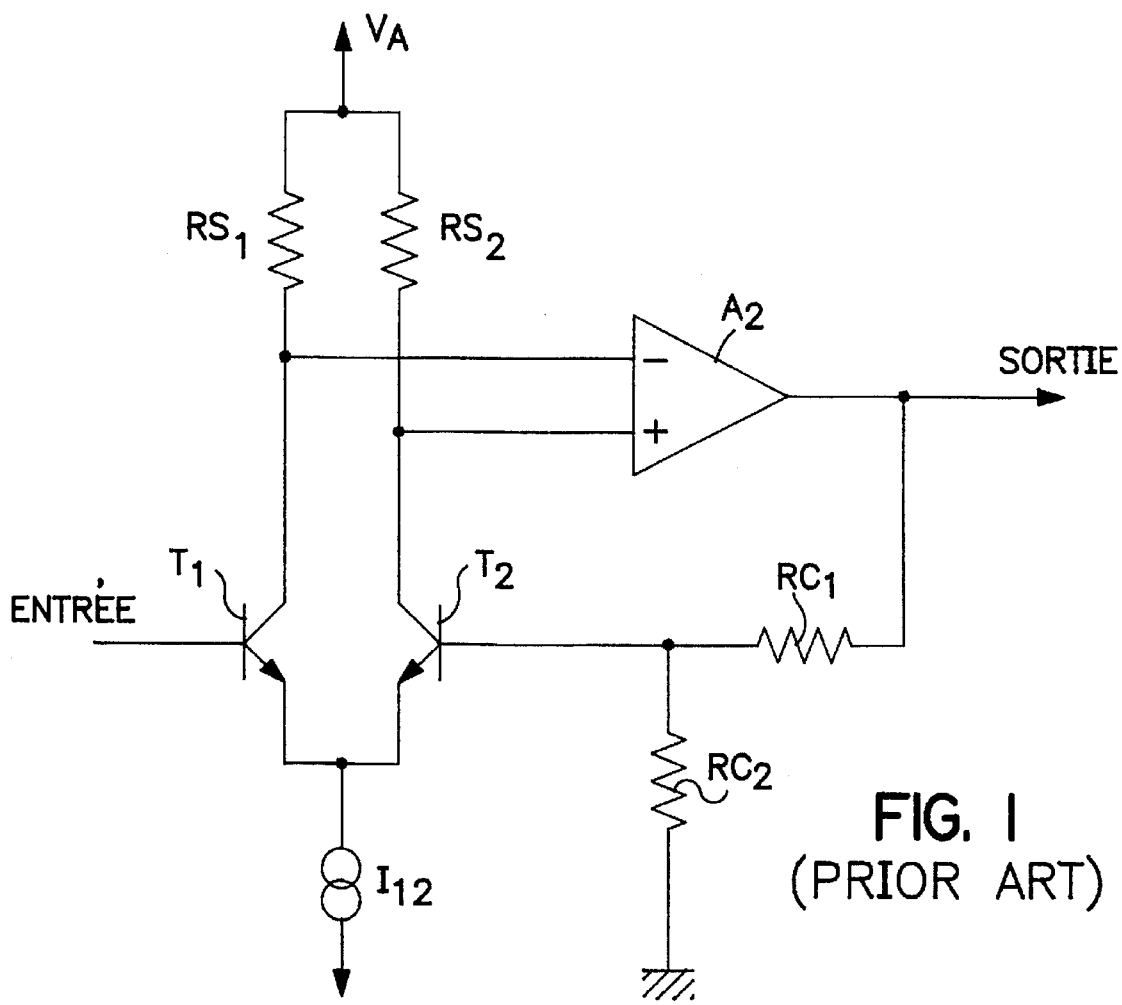
FIG. 1 shows a two-stage amplifier of the prior art.

The fed back audio amplifier circuits of known type frequently have a structure close to that shown in FIG. 1: They use a differential input stage with two transistors $T_1$ and $T_2$ coupled by the emitters to a source of current $I_{12}$ and an amplifier $A_2$ the inverting input of which is coupled to the collector of the transistor $T_1$ (connected to a source of feed current $V_A$ over a resistor $R_{S1}$) and/or the non-inverting input of which is coupled to collector of the transistor $T_2$ (connected to a source of feed current $V_A$ via a resistor $R_{S2}$). The feedback is obtained by cross-coupling the output of the amplifier $A_2$ to the base of the transistor $T_2$ over a resistive divider bridge ($RC_1$, $RC_2$). The linearity of such a circuit results primarily from the action of the global feedback which reduces the non-linearities.

The theory which explains the action of the feedback is frequently formulated as follows:

Assume an amplifier $A_0$ the input voltage of which is v, and the output voltage V. A transfer function defines the relation between these two values, namely:

$$V=f(v)$$

This transfer function can be developed in accordance with Taylor and is written:

$$V=f(v)=a_0+a_1v+a_2v^2+a_3v^3+a_4v^4+a_5v^5+\ldots$$

The distortion is generated by the non-linear part D of this function:

$$D(v)=a_2v^2+a_3v^3+a_4v^4+a_5v^5+\ldots \quad (1)$$

One can therefore write:

$$V=A_0(v-v_0)+D(v) \quad (2)$$

with $A_0$ = the gain of the amplifier, $$v_0 = v'_0 + \frac{D(v'_0)}{A_0},$$

with $v'_0$ = the input offset voltage = the voltage which must be applied to the input in order to obtain a zero voltage at the output. In general, $v_0 = v'_0$ and in the following text $v_0$ will be assimilated to the offset voltage.

$D(V)$ = the non-linear part of the transfer function which generates the distortion.

Figure 2:
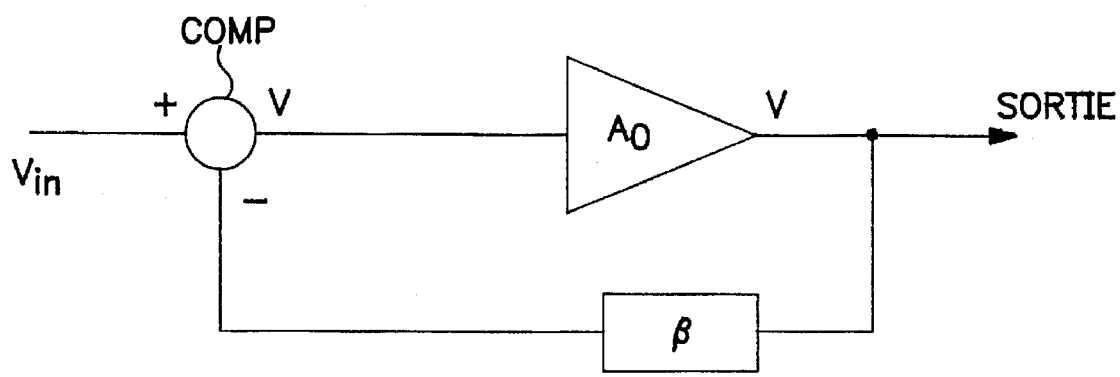
FIG. 2 shows an amplifier having a conventional feedback.

The application of the feedback leads to re-injecting the input signal via a network of gain $\beta$ (see FIG. 2). A comparator COMP effects the comparison between the output signal of the network and the input signal of the circuit $V_{in}$.

The input voltage of the amplifier $A_0$ becomes:

$$v = v_{in} - \beta V \quad (3)$$

By eliminating v between equations (2) and (3), one finds the transfer function of the amplifier looped back by the feedback:

$$V \simeq \frac{A_0}{1 + A_0\beta} (v_{in} - v_0) + \frac{D(v)}{1 + A_0\beta} \quad (4)$$

which can also be written:

$$V = \frac{1}{\beta} \frac{1}{1 + \frac{1}{A_0\beta}} (v_{in} - v_0) + \frac{D(v)}{1 + A_0\beta} \quad (5)$$

If the gain of the amplifier is high, one has: $A_0\beta \gg 1$; the transfer function (5) becomes:

$$V \simeq \frac{1}{\beta} (v_{in} - v_0) + \frac{D(v)}{A_0\beta} \quad (6)$$

The comparison of the transfer functions of the open loop amplifier (2) and of the closed loop amplifier (6) shows the effects of the feedback:

The feedback imposes on the circuit a gain equal to the reciprocal of the gain of the feedback network (provided that the initial gain of the circuit is sufficiently high).

The input offset voltage is not affected by the feedback.

The distortion is divided by the loop gain: $A_0\beta$

Therefore, one ordinarily seeks to increase the open loop gain of the amplifier circuits in order to increase the loop gain and thus improve the closed-loop linearity. However, in the audio field, the application of this strategy does not appear to give satisfactory acoustic results when extreme quality is sought. Such a failure is explained by the more exhaustive analysis of the distortion phenomena in the amplification stages which follows:

If one sets:

$$d(v) = \frac{D(v)}{A_0} \quad (7)$$

one can write the transfer function of the amplifier in open loop in the form:

$$V = A_0(v - v_0 + d(v)) \quad (2')$$

The transfer function of the amplifier in closed loop thus becomes $$V = \frac{1}{\beta} (v_{in} - v_0 + d(v)) \quad (6')$$

A comparison of the new expressions of the transfer functions of the amplifier in open loop (2') and of the amplifier in closed loop (6') better shows the effects of the feedback on the non-linearity: d(v) is an intrinsic distortion defined at the input, as the offset voltage is defined at the input. As the offset voltage, the intrinsic distortion is amplified with the gain imposed by the feedback. It can be considered that the amplifier $A_0$ (FIG. 2) linearly amplifies the voltage which has a distortion specific to the comparison function between $V_{in}$ and $\beta V$, and that this distortion is not compensated for by the feedback loop; as the offset voltage, this intrinsic distortion can be assimilated to a systematic error of measurement.

In a feedback amplifier, the distortion present at the output is therefore the intrinsic distortion multiplied by the gain imposed by the feedback. According to the invention, in order to control the distortion, there is used a strategy of using the feedback which is more elaborated than the simple search for a high gain in open loop. Upon the design of an amplifier circuit, the gain of the amplifier in closed loop ($1/\beta$) is very frequently defined in advance; thus, in order to reduce the distortion, the parameter to be monitored in open loop is not the gain $A_0$, which it is customarily desired to increase by all means, but the intrinsic distortion, which it is necessary to try to minimize.

The intrinsic distortion is defined by:

$$d(v) = D(v)/A_0 \quad (7)$$

This formula shows that the increase in the gain $A_0$ in open loop leads to a gain of linearity in closed loop only if this increase is not represented by an equal or greater increase in the open-loop distortion. In order to control the distortion, it is necessary to control D(v). Now, D(v) is of the form:

$$D(v) = a_2 v^2 + a_3 v^3 + a_4 v^4 + a_5 v^5 + \ldots \quad (1)$$

$$D(v) = v^2 (a_2 + a_3 v + a_4 v^2 + a_5 v^3 + \ldots) \quad (1')$$

In accordance with this formula, D(v) increases in first approximation as the square of v (the open loop input voltage); it is therefore necessary that this voltage be as low as possible.

By replacing V defined by (4) in (3) one can express V as a function of $v_{in}$:

$$v = \frac{v_{in}}{1 + \beta A_0} + \frac{\beta A_0 v_0}{1 + \beta A_0} - \frac{\beta D(v)}{1 + \beta A_0} \quad (8)$$

taking $A_0\beta \gg 1$ and (7) into account, one obtains:

$$v = \frac{v_{in}}{\beta A_0} + v_0 + d(v) \quad (9)$$

However, this analysis is not complete: The load of the amplifier also influences v. If one calls $DV$ the output voltage drop caused in open loop by the supply of current to the load, the output voltage is:

$$V_{out} = V - DV$$

$$V_{out} = A_0(v - v_0 + d(v)) - DV$$

By placing:

$$\delta V = DV/A_0$$

one obtains:

$$V_{out} = A_0(v - v_0 + d(v) - \delta V) \tag{2'''}$$

The feedback action can be written:

$$v = v_{in} - \beta V_{out} \tag{3'}$$

The transfer function of the amplifier in closed loop becomes:

$$V_{out} = 1/\beta (v_{in} - v_0 + d(v) - \delta V) \tag{6''}$$

The input voltage is therefore $$v = \frac{v_{in}}{\beta A_0} + v_0 + d(v) - \delta V \tag{9'}$$

Figure 3:
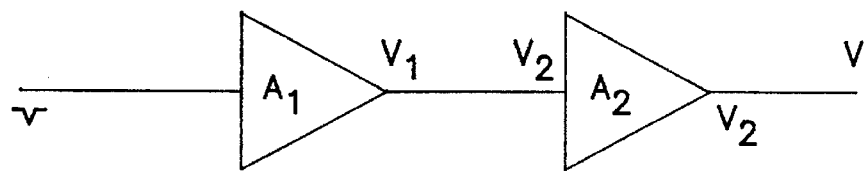
FIG. 3 shows two amplifier stages in series.

The analysis of the special case of two amplifiers in series (FIG. 3) makes it possible to break down the intrinsic distortion, to understand the weaknesses of the prior art, and to adopt the strategy of control of distortion which forms the object of the present invention.

Let there be two amplifiers in series $A_1$ and $A_2$ having the gain $A_{01}$ and $A_{02}$ respectively, and having $f_1$ and $f_2$ as transfer function.

By using the two transfer functions expressed in accordance with (2''), one has:

$$V_1 = f_1(v_1) = A_{01}(v_1 - v_{01} + d_1(v_1)) \tag{10}$$

$$V_2 = f_2(v_2) = A_{02}(v_2 - v_{02} + d_2(v_2)) \tag{11}$$

and by taking into account $v = v_1$, $V_2 = V$, and $V_1 = v_2$, one obtains the global transfer function:

$$V = A_{01} A_{02} \left( v - v_{01} - \frac{v_{02}}{A_{01}} + d_1(v) + \frac{d_2(v_2)}{A_{01}} \right) \tag{12}$$

If we analyze this formula, we see that:
the global gain is the product of the gains of the two amplifiers:

$$A_0 = A_{01} A_{02} \tag{13}$$

the offset voltage is given by:

$$v_0 = v_{01} + \frac{v_{02}}{A_{01}} \tag{14}$$

This is primarily that of the first stage, since the offset voltage of the second stage is divided by the gain of the first stage.

the intrinsic distortion is equal to the intrinsic distortion of the first stage plus the intrinsic distortion of the second stage divided by the gain of the first stage:

$$d(v) = d_1(v) + \frac{d_2(v_2)}{A_{01}} \tag{15}$$

The application of a global feedback leads, using (6''), to:

$$V = \frac{1}{\beta} \left( v_{in} - v_{01} - \frac{v_{02}}{A_{01}} + d_1(v) + \frac{d_2(v_2)}{A_{01}} - \delta V \right) \tag{16}$$

Which leads to a distortion which is equal to:

$$D = \frac{1}{\beta} \left( d_1(v) + \frac{d_2(v_2)}{A_{01}} \right) . \tag{17}$$

with an input voltage v which, in accordance with (9'), is equal to:

$$v \simeq \frac{v_{in}}{\beta A_0} + v_0 + d_1(v) + \frac{d_2(v_2)}{A_{01}} - \delta V \tag{18}$$

The analysis of these results makes it possible to understand how one can compensate for the distortion by an optimal action of the feedback; the distortion is given by $$D = \frac{1}{\beta} \left( d_1(v) + \frac{d_2(v_2)}{A_{01}} \right) \tag{17}$$

In order to reduce the distortion, one can act on each term of this expression:
  the term $1/\beta$ is frequently defined in advance and can easily be reduced,
  the term $d_1(v)$ depends on the linearity of the first stage and the amplitude of v; it is therefore preferable that the first stage be linear and that the amplitude of v be low.
  the term $d_2(v_2)/A_{01}$ depends on the linearity of the second stage, the amplitude of $v_2$, and the gain of the first stage; it is therefore preferable that the second stage be linear and that the first stage have a high gain. The amplitude of $v_2$ is related to the amplitude of the output signal and therefore difficult to reduce.

If the gain of the first stage is substantial, it is therefore the linearity of the first stage and the amplitude of v which are critical for the distortion. Now, v is equal to:

$$v \simeq \frac{v_{in}}{\beta A_0} + v_0 + d_1(v) + \frac{d_2(v_2)}{A_{01}} - \delta V \tag{18}$$

In order to reduce the distortion, one can act on each term of the expression of v:
  the term $v_{in}/\beta A_0$ depends on the input signal and the loop gain; the input signal is given; it is therefore preferable that the loop gain be high, and this is a well-known rule,
  the term $v_0$ is related to the offset voltages and is generally considered fixed,
  we have already considered the terms relating to the distortion,
  the term $\delta V$ ($DV/A_0$) depends on the current supplied to the load which is not controlled, the output impedance in open loop which it is preferable to reduce, and the open loop gain which must be high.

This analysis can be summarized by saying that, in an amplification chain which receives feedback, the first stage (that is to say the first active circuit encountered by the signal, that which serves as comparator of the feedback loop) is essential for the linearity, particularly if its gain is substantial, since its intrinsic distortion is not reduced by the action of the feedback. The distortion of the other stages leads to increasing a term of the input signal of the first stage and therefore its intrinsic distortion, but their distortion is masked by the gain of the first stage, while the gain of these stages makes it possible to reduce another term of the input signal.

This enables us to define the rules of design to minimize the distortion in a circuit receiving feedback comprising several stages which can be divided between the first stage $A_1$ and the other stage or stages (regrouped in a second stage) $A_2$:
  It is necessary, first of all, that the first stage $A_1$ be:
  of high gain in order to mask the distortions of the following stages,
  very linear, since its intrinsic distortion is not reduced by the feedback and the actions of the feedback to reduce the non-linearities of the following stages and the voltage drop due to the load increase its input signal.

It is then preferable that the second stage $A_4$ be:

of high gain in order to contribute to reducing the first term of the expression of v (18), linear in order to permit its contribution to the non-linearity of the circuit, despite the masking of its distortion by the gain of the first stage $A_1$, and that thus the compensation of its distortions by the feedback does not cause distortions in the first stage $A_1$.

It is preferable, finally, that the output resistance be low in order to avoid having the reduction in DV by the feedback cause distortions in the first stage $A_1$.

It will be noted that, in accordance with the theory developed above, a local feedback in the first or the second stage leads only to reducing the gain of the stage in question without modifying either its offset voltage nor its intrinsic distortion, and that the impact of a local feedback on the distortion seems negative;

in the case of the first stage, a local feedback reduces the gain of this stage and therefore the global gain, thus increasing the first term of expression (18) and furthermore unmasking the distortion of the second stage, in the case of the second stage, a local feedback reduces the gain of this stage and therefore the global gain, thus increasing the first term of expression (18).

The theory developed above therefore recommends, in order to reduce the distortion, avoiding the local feedbacks and having all of the stages benefit from the entire gain which it is desired to loop back. However, this recommendation does not take into account restrictions imposed by the loop stability problems which, in practice, limit the global loop gain and therefore the global open loop gain. A local feedback can therefore assist in reducing the distortions if it makes it possible to increase the fed back gain by circumventing the loop stability problems.

Furthermore, in order to stabilize the distortion, it is necessary, in the different formulas, to control the terms corresponding to the continuous voltages (the offset voltages); it is currently agreed that these terms cause the intervening only of continuous voltages which are not related to the distortion. Actually, the continuous voltages are important, since they modify the points of polarization of the active elements. In particular, relationship (18) shows that the input global offset voltage primarily determines the input continuous voltage and therefore modifies the point of polarization of the input stage which is determinative for the distortion: according to the operating point on the curve of the transverse function of the first stage, the nature and the amplitude of its distortions may change.

An important point for the stability of the distortion is therefore the stability of the offset voltage; in fact, it is currently admitted that the transfer functions are stable, while they depend on characteristics of the components and that the latter (in particular, the transistors) have their characteristics (primarily their base-emitter voltages) vary with the temperature. The variations in temperature are related to ambient thermal conditions and to the internal dissipation which is a function of the signal (thermal distortion). Among the causes of variation of the offset voltage, there must also be noted the changes in the feed voltages.

In the case of audio signals, the non-stability of the distortion reinforces the perception thereof and therefore produces effects which are very disagreeable to the ear.

This leads us to supplementing the rules of design of audio amplifiers: In order to stabilize the distortion, the offset voltages produced by the circuit must not be reinjected in the input of the first stage by the feedback loop. It is furthermore preferable that the first stage (the comparator of the loop) be very stable and without thermal distortion.

It will be noted that the traditional strategy for controlling distortion, namely an increase of the open loop gain, leads to obtaining, at the input of the comparator of the amplifier (at a point where the feedback has no effect on the distortion), the desired signal ($v_{in}$) divided by the loop gain, that is to say very small as compared with the offset; thus a modulation of the offset voltage will have the pernicious effects described above on the distortion.

It will be noted that a local feedback in the second stage does not change the global offset (see (14)) nor the problems of modulations of distortion and that a local feedback in the first stage degrades the global offset by unmasking that of the second stage and may worsen the distortion modulation problems.

Let us analyze the distortion of the diagram of FIG. 1: In this very conventional diagram, the first stage is formed of a differential circuit having two transistors $T_1$ and $T_2$. Its transfer function is of the form:

$$I_{out} = \frac{I_0}{1 + \exp\left(\frac{Q(v - v_0)}{kT}\right)} \tag{19}$$

It is scarcely linear since v has a certain amplitude. In general, the following stages are little linear since one expects a global linearity resulting from their high gain and the action of the feedback. This action can therefore be represented, at the input of the amplifier, by signals of an amplitude sufficient to degrade at the input the intrinsic distortion which will be amplified with the gain of the circuit.

It is necessary to minimize v. An increase of $A_{o2}$, as the conventional theory causes many designers to do, with the limits imposed by the stability of the loop, only makes it possible to decrease the first term of the expression (18); if this increase leads to degrading the linearity of the second stage, it is possible that, despite the masking of the distortion of the second stage $A_2$ by the gain of the first stage $A_1$ (see (17)), the global distortion is increased. On the other hand, this increase serves to increase the risks of modulation of the distortion by the offset variations.

The distortion of this circuit is, in fact, sensitive to the variation of the input offset voltage of the entire circuit (variations of the feeds and of the junction temperatures of the transistors), and to the thermal distortion of the first stage ($T_1$, $T_2$), since the desired signal is weak there as compared with the derivatives of the continuous signal; furthermore, ordinarily one scarcely worries about variations of the offset voltage of the second stage since one counts on the global feedback to stabilize the operating point. For this, one even at times reinforces the continuous feedback by a capacitor in series with $R_{c2}$ or by an integrator circuit in parallel with $R_{c1}$. This action can only worsen the distortion modulation problems.

The use of a local feedback by emitter resistors $R_1$ and $R_2$ (between the emitter of $T_1$ and the source of current $I_{12}$, and between the emitter of $T_2$ and the source of current $I_{12}$ respectively) does not solve the problems of distortion modulation by the polarization derivatives; the first stage is more linear but its gain is less. Its thermal distortion is not modified since the dissipation remains the same. Its intrinsic distortion is not modified and therefore its own non-linearities always have the same effect and the non-linearities of the other stages are less masked. On the other hand, this arrangement can simplify the stability problems of the feedback loop.

In accordance with the invention, with the application of the theory explained above, one seeks:
- to stabilize the distortion by avoiding that the continuous very low frequency voltages are reinjected via the global feedback loop, while stabilizing the operating point of the circuits which follow the first stage,
- then to increase the stability of the distortion by stabilizing the operation of the comparator of the loop (first stage),
- and, finally, to reduce the distortion.

For this, one combines, within a circuit which globally receives feedback, a first stage (the comparator of the loop, preferably very linear and of high gain) which preferably remains stable when the amplitude of the signals varies, and a second stage the stability of which (and possibly the linearity) is (are) improved by a feedback. Furthermore, in order to avoid the problems related to the amplification of the continuous very low frequency voltages coming from the first stage, a highpass filtering is effected, either by means of a highpass filter introduced between the first and the second stage or by feedback of the second stage.

The circuit in accordance with the invention is developed to amplify audio signals having no continuous or very low frequency component. In the case of the presence in the signal to be processed of a continuous component or of very low frequency signals, the absence of feedback on these signals would lead to a high level for these signals at the place of the first stage and could thus induce, with the non-linearities of this stage, a modulation of the distortion; it is therefore preferable to eliminate these signals upstream of the circuit by filtration in order to avoid that they fix the operating point of the first stage.

Figure 4:
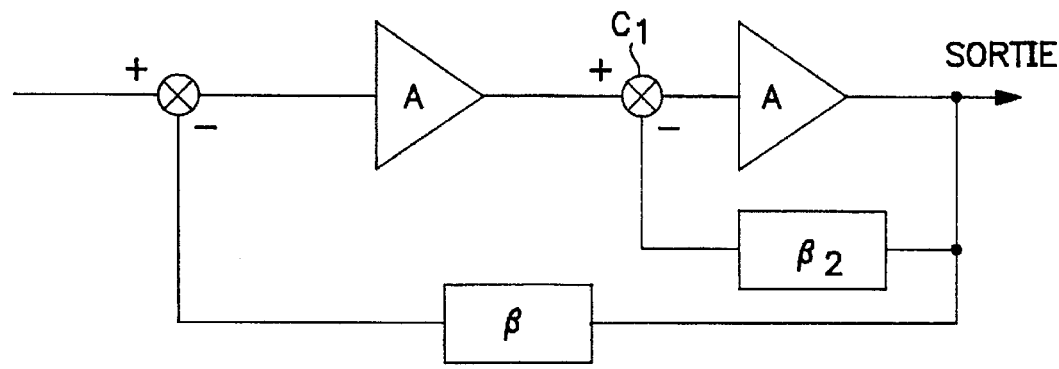
FIG. 4 is a diagram of a two-stage amplifier according to the invention.

The amplifier which is the object of the present invention is composed, in the case of FIG. 4, of two amplifier stages, looped in a global feedback $\beta$, the second stage of which sees its continuous operation stabilized by a second feedback $\beta_2$ which is specific to it.

Figure 5:
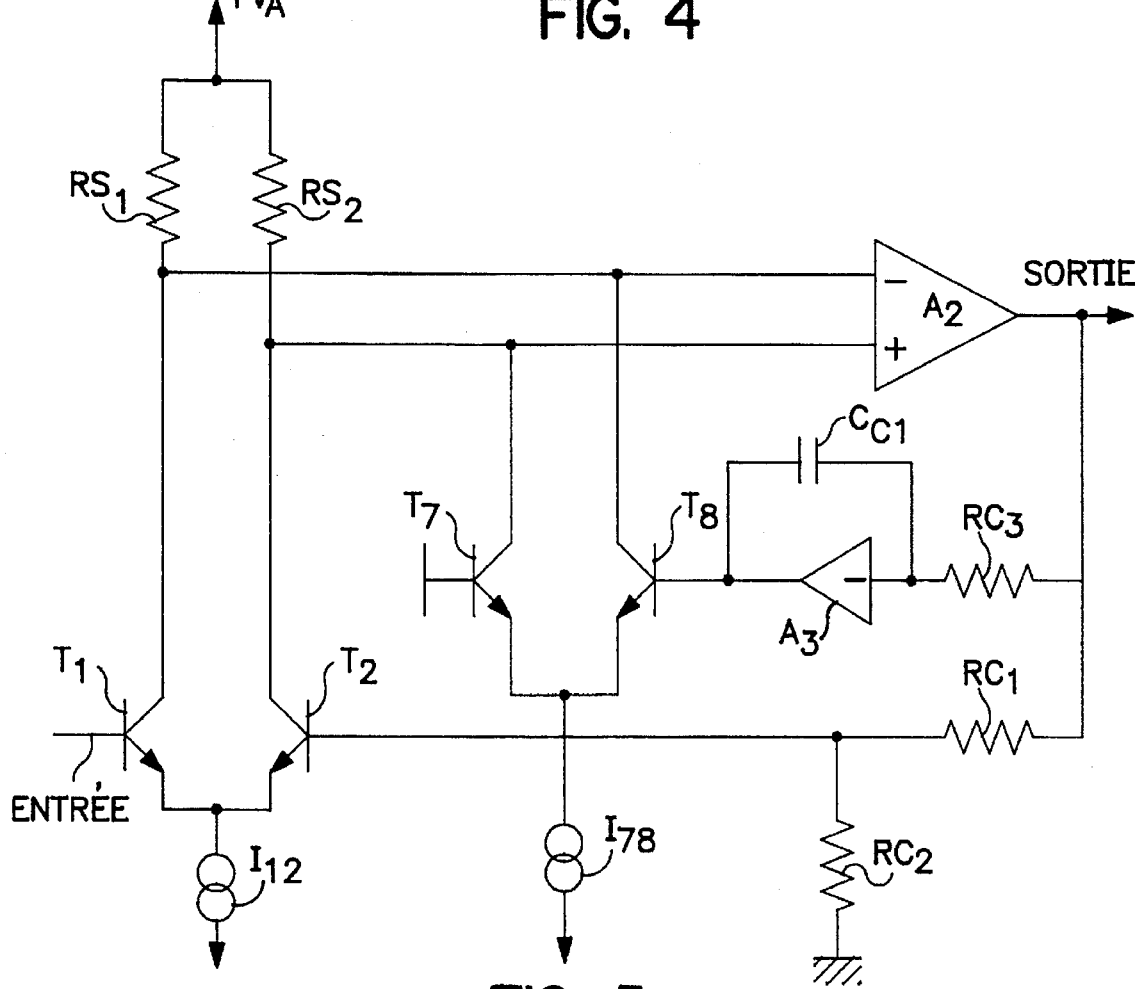
FIG. 5 shows a preferred embodiment of the amplifier of FIG. 4.

FIG. 5 shows an example of such a circuit developed on the basis of the diagram of FIG. 1, in which there has been added a second differential input stage with two transistors $T_7$ and $T_8$ of the same polarity as $T_1$ and $T_2$, coupled by the emitters to a source of current $I_{78}$, the collector of $T_7$ being coupled to the collector of $T_2$ and the collector of $T_8$ being coupled to the collector of $T_1$, the base of $T_7$ is connected to a fixed potential which may be ground, the base of $T_8$ is connected to the output of $A_2$ which is the output of the circuit across an integrating circuit formed of an amplifier $A_3$ the inverting input of which is connected to the output of $A_2$ over a resistor $R_{c3}$ and to its own output via a condenser $C_{c1}$, the base of $T_8$ is thus connected the output of $A_3$. The added circuit producing with $A_2$ an active filter which at the same time eliminates the continuous and very low frequency signals coming from the first stage and those which could be generated in $A_2$. The operating point of $A_2$ is thus stabilized.

It will be noted that while this embodiment is reminiscent of the prior art in the case invoked above in which an integrator circuit in the feedback network stabilizes the output quiescent point, the stabilization here is obtained by acting on a point downstream of the input comparator which $T_1$ and $T_2$ constitute and therefore without interference the operation thereof, while in the prior art, the operation of the first stage is disturbed by acting on its polarization point in order to stabilize the output quiescent point.

Figure 6:
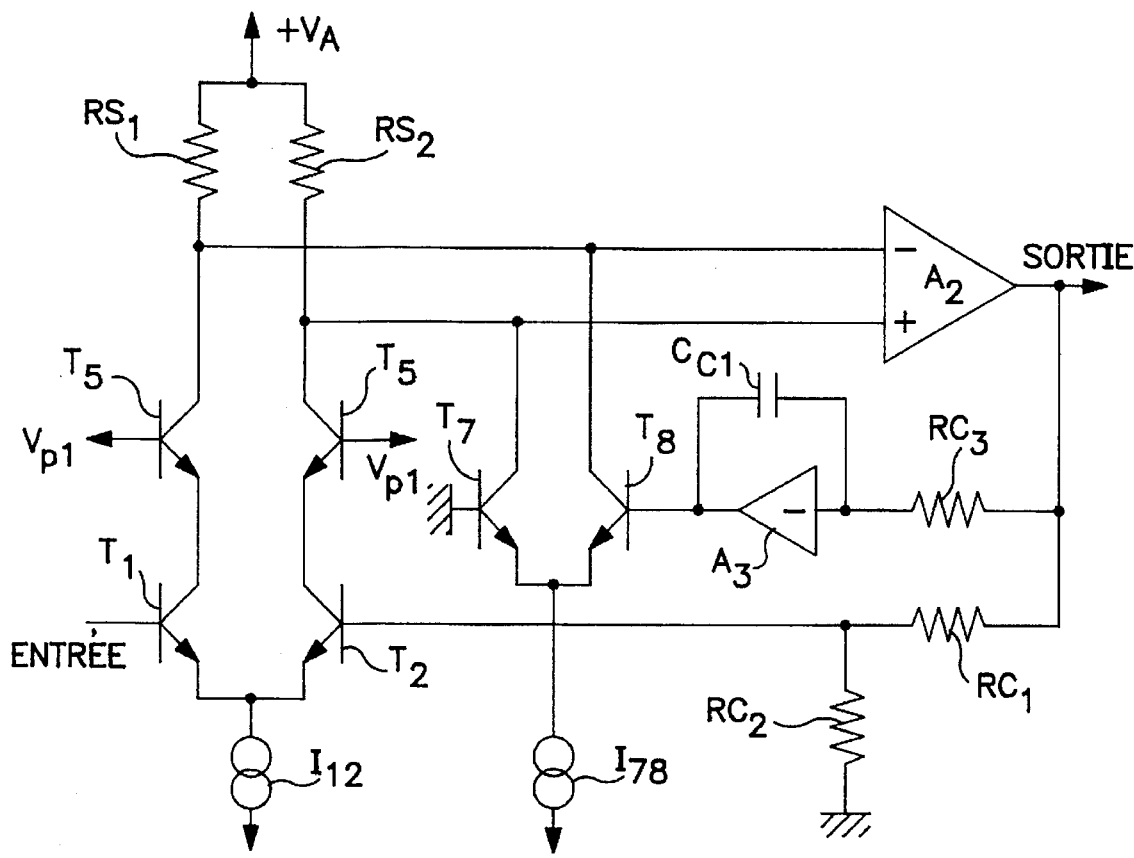
FIG. 6 shows another preferred embodiment of the amplifier of FIG. 4.

FIG. 6 shows another example of such a circuit developed on the basis of the diagram of FIG. 5, in which the stability of the distortion has been improved by limiting the dissipation of $T_1$ and $T_2$, by limiting the power which is dissipated there due to a double cascade circuit: one transistor $T_5$, of the same polarity as $T_1$, connects the collector of $T_1$ to the rest of the circuit, its emitter being coupled to the collector of $T_1$, its base being connected to a potential $V_{p1}$ such that the emitter-collector voltage of $T_1$ is low (typically 0.8 V); one transistor $T_6$, of the same polarity as $T_2$, connects the collector of $T_2$ to the rest of the circuit, its emitter being coupled to the collector of $T_2$, its base being connected to a potential $V_{p1}$ such that the emitter-collector voltage of $T_2$ is low (typically 0.8 V). $V_{p1}$ could be replaced by voltages controlled respectively by slightly greater voltages (typically by 0.8 V) than the emitter potentials of $T_1$ and $T_2$ respectively.

The reduction of the base-emitter voltages of the transistors of the comparator of the first stage to a low value is a simple way to reduce their dissipation and thus to make their temperature and therefore their electrical characteristics independent of the amplitude of the signals treated.

Figure 7:
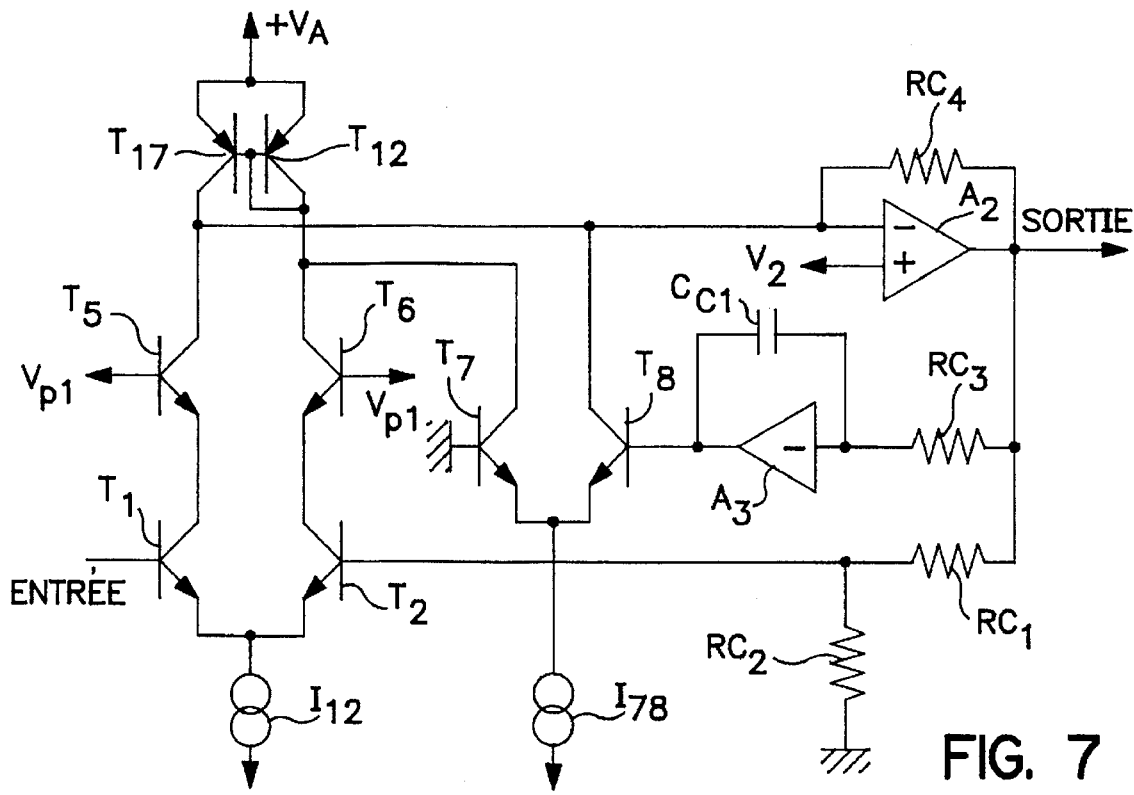
FIG. 7 shows another preferred embodiment of the amplifier of FIG. 4.

FIG. 7 shows another example of such a circuit developed on the basis of the diagram of FIG. 6, in which the gain of the first stage has been increased by use of an active load (and therefore one of high impedance) and the second stage is provided with feedback. This makes it possible to increase the feedback ratio reducing the non-linearities of the second stage and the voltage drop due to the load, and thus to reduce their contribution to the input voltage of the first stage, without increasing the open loop gain and therefore without causing problems of stability of the global loop.

For this, the resistors $R_{s1}$ and $R_{s2}$ are replaced by two transistors $T_{11}$ and $T_{12}$ of polarity opposite to $T_1$ and $T_2$, the emitters of $T_{11}$ and $T_{12}$ being connected to the feed potential $V_A$, the bases of $T_{11}$ and $T_{12}$ being coupled to each other and to the collector of $T_{12}$, the collector of $T_{11}$ being coupled to the collectors of $T_5$ and $T_8$ and to the inverting input of $A_2$, the collector of $T_{12}$ being coupled to the collectors of $T_6$ and $T_7$, a feedback resistor $R_{c4}$ being connected between the inverting input of $A_2$ and the output of $A_2$, the non-inverting input of $A_2$ (if any) being connected to a fixed potential $V_2$.

It is possible to improve the linearity of the voltages described above by using a more linear circuit as comparator of the global loop (the first stage). This can be obtained by the increase in gain supplied by a few active elements and by a local feedback, or else by a circuit in which the non-linearities intrinsic in the active elements compensate for each other, the stability of these circuits being obtained by reducing and/or stabilizing the dissipations taking place in the components critical for the transfer function.

Figure 8:
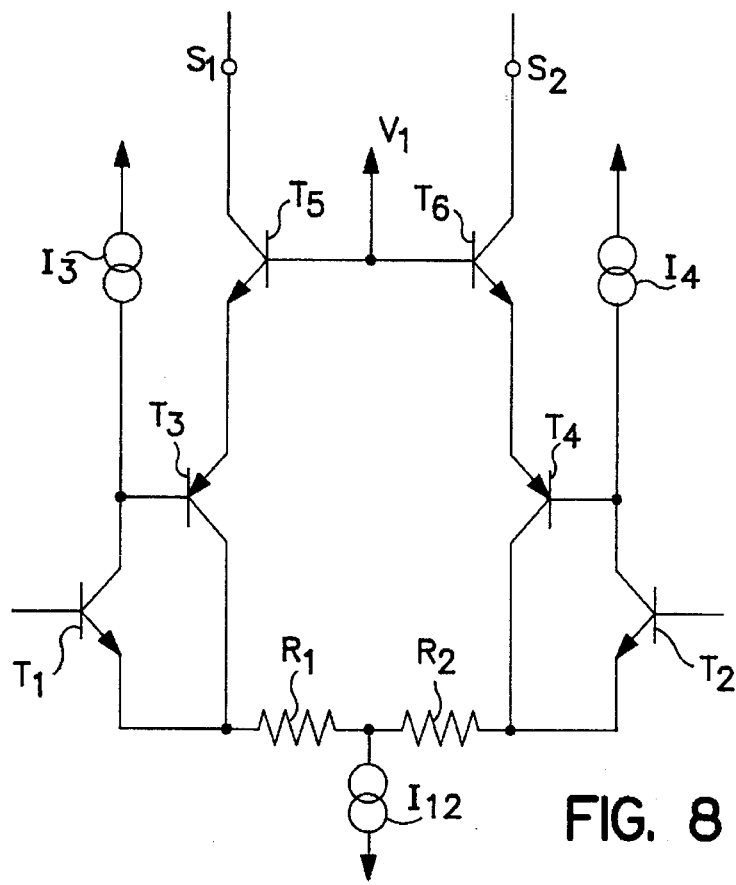
FIG. 8 shows a preferred embodiment of the first stage of the amplifier of FIG. 4.

FIG. 8 shows an example of such a circuit in which the linearity has been obtained by the use of several transistors and by two local current feedbacks which stabilize the emitter currents and therefore the voltages $V_{BE}$ of the two input transistors. The thermal distortion y is reduced since the two input transistors also have their collector voltages stabilized at a low value by the reference voltage $V_1$.

FIG. 8 proposes, in accordance with the invention, a circuit which makes it possible further to eliminate the above-mentioned problems of thermal distortion. A transistor $T_3$ has its base connected to the collector of $T_1$, and its collector to the emitter of $T_1$. A transistor $T_4$ has its base connected to the collector of $T_2$ and its collector to the emitter of $T_2$. The load of the collector of the transistors $T_1$ and $T_2$ is formed by sources of current, $I_3$ and $I_4$ respectively. Two transistors $T_5$ and $T_6$ of the same type as the transistors $T_1$ and $T_2$ have their base brought to a reference potential $V_1$ and their emitters connected to those of the transistors $T_3$ and $T_4$ respectively. The collector of the transistors $T_5$ and $T_6$ constitutes the outputs $S_1$ and $S_2$ of the differential stage (resistors $R_{S1}$ and $R_{S2}$). It will also be noted that, as variant, the emitters of the transistors $T_1$ and $T_2$ can be coupled by a resistor $R_{12}$ and each connected to a source of current, $I_1$ and $I_2$ respectively (not shown).

In this circuit, the feedback current is fixed by the difference between the potential of the collector of the transistors $T_1$ and $T_2$ and the reference voltage $V_1$. In fact, the transistors $T_3$ and $T_5$, on the one hand, and $T_4$ and $T_6$, on the other hand, of opposite type being coupled by their emitters, the current passing through their collector-emitter path is a function of the difference between the voltages applied to their bases. Furthermore, the collector potential of the transistor $T_2$ (or $T_1$) varies little since it is locked to $V_3-V_{BE}(T_6)-V_{BE}(T_4)$, $V_{BE}$ designating the base-emitter voltage of a transistor. The voltage of the collectors of $T_1$ and $T_2$ varies as twice the variation of the base-emitter voltages of the transistors $T_3$ and $T_5$ on the one hand, and $T_4$ and $T_6$ on the other hand. In other words, the potential of the collector of the transistors $T_1$ and $T_2$ is practically equal, plus or minus a given constant, to the reference voltage. Since, furthermore, the current which passes over the collector-emitter path of the transistors $T_1$ and $T_2$ is fixed by the sources of current $I_3$ and $I_4$, the power dissipated in the transistors $T_1$ and $T_2$, which is proportional to the product $V_{CE} \times I_C$, is substantially constant ($I_C$ designating the collector current and $V_{CE}$ the collector-emitter voltage of a transistor).

As the potential of the collector of the transistors $T_1$ and $T_2$ varies little, the sources of current $I_3$ and $I_4$ can be replaced by resistors of fixed value (for instance 1 MOhm).

Any variation of the input potential of the transistor $T_1$ (or $T_2$) tends to modify the base-emitter voltage $V_{BE}$ of this transistor. This modification of $V_{BE}$ induces a change in its collector current. This change in current is found again in the base current of the transistor $T_3$ (or $T_4$), since the load of the transistor $T_1$ (or $T_2$) has a constant current $I_3$ (or $I_4$). The variation of the base current of the transistor $T_3$ (or $T_4$) results in a variation of its collector current which, by the effect of the emitter resistance of the transistor $T_1$ (or $T_2$), leads to reproducing the variations of the input potential.

Thus, the emitter voltage of the transistor $T_1$ (or $T_2$) is controlled by its base voltage with a constant offset of the first order, since it is the $V_{BE}$ corresponding to g current imposed by the source of current $I_3$ (or $I_4$).

The thermal distortion results from the short-term variations of the junction temperatures of the transistor as a function of the signals. In the prior art, the dissipations modulated by the amplitude of the signals vary the characteristics of the transistors, primarily the voltage $V_{BE}$ and the current gain. Thus, in the conventional differential circuit, the thermal variations of the base-emitter voltage $V_{BE}$ have directly the same effect as a variation of the input signal.

In the circuit of FIG. 8, the dissipation of the transistor $T_1$ (or $T_2$) is stabilized. It, therefore, does not produce any modulation of the voltage $V_{BE}$. The transistor $T_3$ (or $T_4$) works with a low emitter-collector voltage $V_{CE}$ while the transistor $T_5$ (or $T_6$) sees variations in current and in emitter-collector voltage. The voltages $V_{BE}$ of the transistors $T_3$ (or $T_4$) and $T_5$ (or $T_6$) which work in current in the loop, have little effect on the circuit by reason of the small variation of the emitter-collector voltage of the transistor $T_1$ (or $T_2$). The variations in current gains (essentially for the transistor $T_5$ (or $T_6$) used as common base) have little effect on the circuit due to the current feedback loop.

The value of the reference voltage $V_1$ is selected in such a manner that the collector-base voltage $V_{CB}$ of the transistors $T_1$ and $T_2$ is relatively low, namely less than a few volts, and preferably less than 1 volt, and typically on the order of 200 to 300 millivolts.

Figure 9:
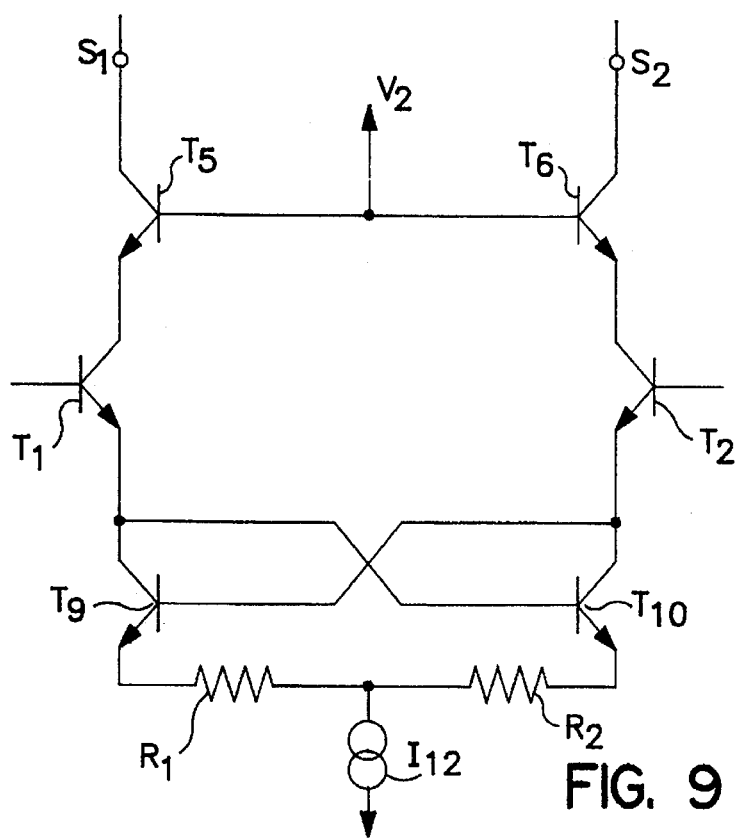
FIG. 9 shows another embodiment of the first stage of the amplifier of FIG. 4.

EXAMPLE $V_A$=15 volts; $v_1$=2 volts $I_{12}$=10 mA; $I_3$=$I_4$-2.5 mA $R_{S1}$=$R_{S2}$=4 KOhm $R_1$=$R_2$=100 Ohm FIG. 9 shows another example in which the linearity has been obtained by compensation of the voltages $V_{BE}$ in the two branches of the differential circuit. Two transistors $T_9$ and $T_{10}$ of the same type as the transistors $T_1$ and $T_2$ have their base and their collector in crossed connection. The collector of $T_9$ and the base of $T_{10}$ are connected to the emitter of $T_1$. The resistors $R_1$ and $R_2$ are connected in series to the emitters of $T_9$ and $T_{10}$. The thermal distortion is reduced due to the cascode configuration of the transistors $T_5$ and $T_6$ which imposes a low collector voltage on the input transistors and therefore limits the power dissipated in these transistors.

Figure 10:
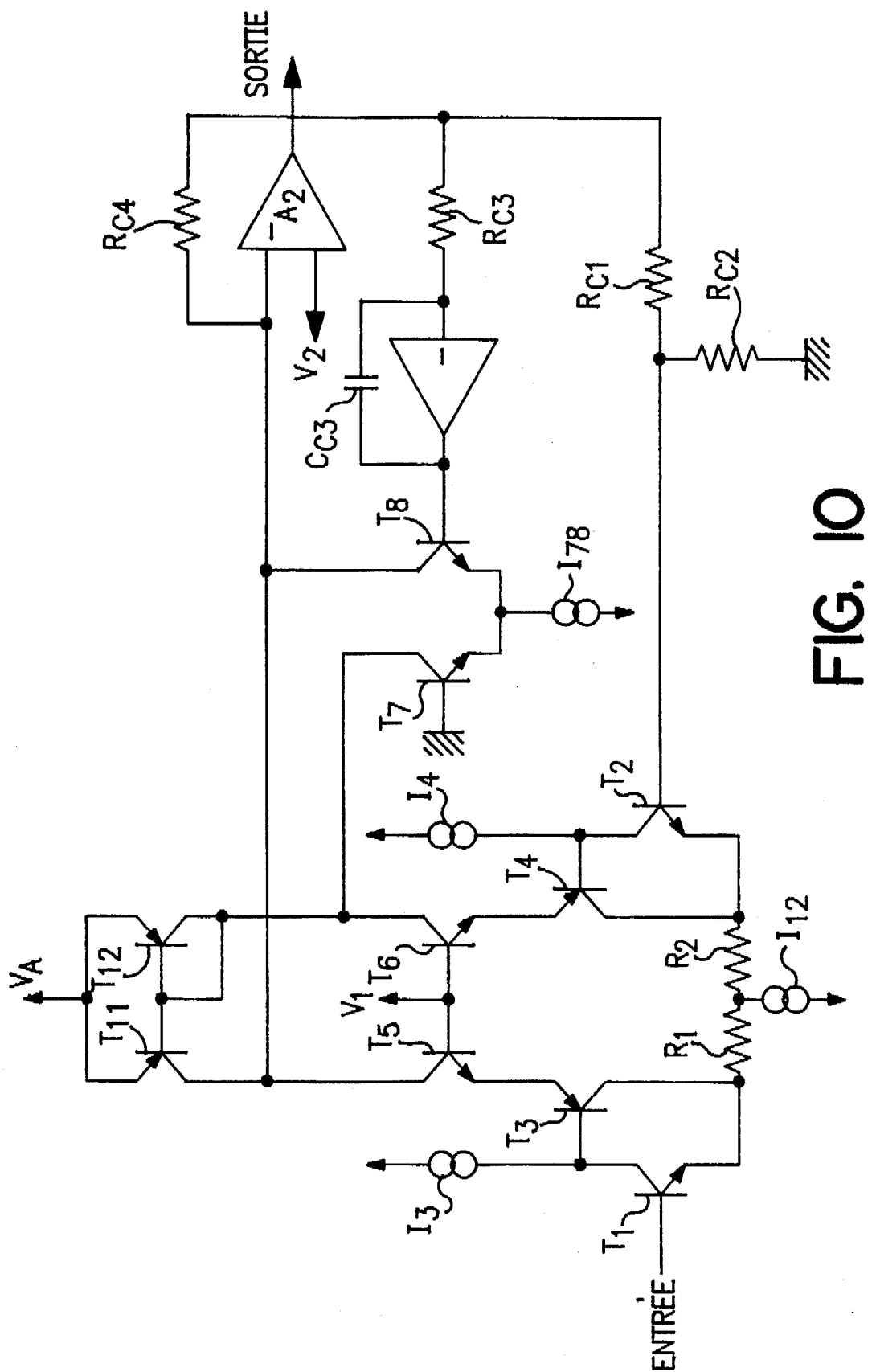
FIG. 10 shows a preferred embodiment of the amplifier of FIG. 5.

FIG. 10 shows a preferred embodiment of the amplifier of FIG. 4, which is obtained by the use in the diagram of FIG. 7 of the input circuit described in FIG. 8. A transistor $T_3$ has its base connected to the collector of $T_1$ and its collector to the emitter of $T_1$. A transistor $T_4$ has its base connected to the collector of $T_2$ and its collector to the emitter of $T_2$. The load of the collector of the transistors $T_1$ and $T_2$ is formed by current sources, $I_3$ and $I_4$ respectively. Two transistors $T_5$ and $T_6$ of the same type as the transistors $T_1$ and $T_2$ have their base brought to a reference potential $V_1$ and their emitters connected to those of the transistors $T_3$ and $T_4$ respectively. The collector of the transistor $T_5$ is coupled to the collectors of $T_{11}$ and $T_8$ and to the inverting input of $A_2$, the collector of the transistor $T_6$ is coupled to the collectors of $T_{12}$ and $T_7$ and to the base of $T_{12}$.

As variant of FIG. 7, the first stage may have an input stage which is not of differential type and the resistive divider bridge ($R_{C1}$, $R_{C1}$) is arranged between the output of the second stage ($A_2$) and an input of the first stage. The local feedback loop comprises an integrator circuit ($A_3$, $C_{C1}$) and a feedback stage which is of differential type. The input of the integrator circuit is connected to the output of the second stage ($A_2$) and its output is connected to a first input of the feedback differential stage ($T_7$, $T_8$), which has a second input at constant potential $V_{p1}$. An output of the differential stage ($T_7$, $T_8$) is coupled to the input of the stage $A_2$ in such a manner as to produce an active filter. This active filter makes it possible to eliminate, on the one hand, the continuous or low frequency signals coming from the first stage and, on the other hand, the continuous or low frequency signals generated in the stage $A_2$, which stabilizes its operating point.

I claim:

1. A transistor amplifier for audio signals comprising a first stage and a second stage having a global feedback loop between the output of the second stage which output constitutes the output of the amplifier and the input of the first stage, the second stage also having a local feedback loop between its output and its input, the output of said first stage being connected to the input of said second stage and the first stage having no local DC feedback between its output and its input, characterized by the fact that said amplifier further comprises means for preventing the offset voltage present at the output of the first stage from being reinjected into the input of said first stage via said global feedback loop, and by the fact that the local feedback loop is such that the second stage receives feedback at least for continuous output signals in such a manner that low frequency interference signals generated in the second stage are reduced by the feedback of the second stage, which stabilizes its output operation point.

2. An amplifier according to claim 1, characterized by the fact that at least one of the input circuits of the first and the second stages has at least one critical transistor capable of producing variations of its transfer function as a function of the amplitude of the signals, and by the fact that said at least one critical transistor is adapted to have a low and/or constant collector-emitter voltage $V_{CE}$ with a substantially constant current in its main current path so as to produce a stable and/or low thermal dissipation in said at least one critical transistor.

3. An amplifier according to claim 2, characterized by the fact that at least one critical transistor of stable or low dissipation forming part of the input circuit of the said first stage is isolated thermally from the variations in temperature induced by other components and stabilized thermally by a stabilization which is external to them.

4. An amplifier according to claim 1, characterized by the fact that said first stage ($T_1$, $T_2$) uses an active load in such a manner as to impart to it a high gain and by the fact that said second stage ($A_2$) receives feedback also for the signals in the audio band.

5. An amplifier according to claim 1, characterized by the fact that the input circuit of said first stage is of great linearity and has two substages (($T_1$, $T_3$), ($T_2$, $T_4$)), in series to form a local feedback.

6. An amplifier according to claim 5, characterized by the fact that the first stage comprises two modules each of which has a first transistor ($T_1$) of a first type of conductivity the base of which constitutes an input terminal for an input signal, the emitters of the first transistor ($T_1$) of each module being coupled via an impedance to form a differential stage, and a means for maintaining a substantially constant current in the collector-emitter path of the first transistor ($T_1$), said means comprising a feedback circuit ($T_3$, $T_5$) having a main current path between an active terminal ($s_1$) constituting an output of the first stage and the emitter of the first transistor ($T_1$), that said means is formed by a first current source ($I_3$) connected to the collector of the first transistor ($T_1$), and that the feedback circuit is so arranged that the values of said main current is a function of the difference between the voltage ($V_1$) of a source of reference voltage and the potential of the collector of the first transistor ($T_1$), the gain of the feedback circuit being selected in such a manner that the potential of the collector of the first transistor ($T_1$) is substantially constant.

7. An amplifier according to claim 6, characterized by the fact that the main current path of the feedback circuit comprises a second transistor ($T_3$) of a second type of conductivity opposite the first type of conductivity, the collector of which is connected to the emitter of the first transistor ($T_1$), the base of which is connected to the collector of the first transistor ($T_1$), and the emitter of which is connected to the emitter of a third transistor ($T_5$) of a first type of conductivity, the base of which is connected to said reference voltage source ($V_2$), and the collector of which constitutes said output of the first stage.

8. A transistor amplifier according to claim 1, characterized in that said means for preventing the offset voltage present at the output of the first stage from being reinjected into the input of the first stage comprises high-pass filtering means between said first and said second stages.

9. An amplifier according to claim 8, characterized by the fact that the first stage comprises an input stage, that the global feedback loop has a resistive divider bridge ($R_{C1}$, $R_{C2}$) between the output of the second stage and the input of the first stage, and that the local feedback loop comprises an integrator circuit ($A_3$, $C_{C1}$) and a feedback differential stage ($T_7$, $T_8$), the input of the integrator circuit being connected to the output of the second stage ($A_2$) and the output of the integrator circuit being connected to a first input of the feedback differential stage ($T_7$, $T_8$) which has a second input of constant potential, an output of the feedback differential stage ($T_7$, $T_8$) being coupled to a respective input of the second stage ($A_2$), so as to produce an active filter which eliminates, on the one hand, the continuous or low frequency signals coming from the first stage and, on the other hand, those signals generated in the second stage ($A_2$) which stabilizes its operating point.

10. A transistor amplifier according to claim 1, characterized in that said means for preventing the offset voltage present at the output of the first stage from being reinjected into the input of the first stage comprises low-pass filtering means within said local feedback loop.

* * * * *